(12) United States Patent
Saez et al.

(10) Patent No.: US 9,202,584 B1
(45) Date of Patent: Dec. 1, 2015

(54) POWER SUPPLY SLEW RATE DETECTOR (71) Applicant: Freescale Semiconductor, Inc., Austin, TX (US)

(72) Inventors: Richard Titov Saez, Campinas (BR); Walter Luis Tercariol, Campinas (BR)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 55 days.

(21) Appl. No.: 14/272,666

(22) Filed: May 8, 2014

(51) Int. Cl.
  *H03K 5/153* (2006.01)
  *G11C 16/28* (2006.01)
  *G11C 16/30* (2006.01)
  *G01R 19/00* (2006.01)
  *H01L 27/092* (2006.01)

(52) U.S. Cl.
  CPC ............ *G11C 16/28* (2013.01); *G01R 19/0084* (2013.01); *G11C 16/30* (2013.01); *H01L 27/092* (2013.01)

(58) Field of Classification Search
  None
  See application file for complete search history.

(56) References Cited

U.S. PATENT DOCUMENTS

| | | | |
|---|---|---|---|
| 5,456,784 A | 10/1995 | Cogdill et al. | |
| 6,313,664 B1 | 11/2001 | Hall et al. | |
| 7,057,427 B2 | 6/2006 | Wadhwa et al. | |
| 7,135,898 B2 | 11/2006 | Tseng et al. | |
| 8,144,228 B2 | 3/2012 | Gelfand | |
| 8,203,370 B2 * | 6/2012 | Yan | H03K 3/3565 327/205 |
| 8,547,135 B1 * | 10/2013 | Yarlagadda | G06F 1/26 323/281 |
| 9,075,086 B2 * | 7/2015 | Seveau | B60R 16/03 |
| 2004/0109270 A1 | 6/2004 | Stockinger et al. | |
| 2010/0052586 A1 * | 3/2010 | Krauth | H02P 6/182 318/400.32 |
| 2013/0120026 A1 * | 5/2013 | Zanchi | H03K 5/2445 327/77 |
| 2013/0258533 A1 | 10/2013 | Chen | |
| 2014/0347100 A1 * | 11/2014 | Seveau | B60R 16/03 327/63 |
| 2014/0375359 A1 * | 12/2014 | Deloge | H03K 19/00338 327/108 |

OTHER PUBLICATIONS

Stockinger et al, "An active MOSFET Rail Clamp Network for Component and System Level Protection"—Electrical Overstress/Electrostatic Discharge Symposium (EOS/ESD), IEEE 2013 35th, pp. 1-10.

* cited by examiner

*Primary Examiner* — Lincoln Donovan
*Assistant Examiner* — Khareem E Almo
(74) *Attorney, Agent, or Firm* — Luiz von Paumgartten; Fogarty, L.L.C.

(57) ABSTRACT

In some embodiments, a power supply slew rate detector may include a filter circuit having a capacitive element operably coupled to a power supply output provided to a flash memory circuit and a resistive element operably coupled to the capacitive element and to ground, and a Schmitt trigger including an input operably coupled to a node between the capacitive element and the resistive element, the Schmitt trigger further including an output configured to indicate a slew rate of the power supply output.

18 Claims, 5 Drawing Sheets

POWER SUPPLY SLEW RATE DETECTOR

FIELD

This disclosure relates generally to electronic circuits, and, more specifically, to a power supply slew rate detector.

BACKGROUND

In the past, electronic circuit design involved the creation of whole circuits entirely from scratch. Nowadays, however, circuit designers routinely use and reuse existing or standard circuit blocks. In fact, various types of circuit collections and libraries now exist that serve as building blocks to facilitate the development of new circuits.

As the inventors hereof have recognized, often a reusable circuit block may not have been well documented, and certain of its features may need to be tested to assure their proper operation when coupled to other circuits. For example, in the case of flash memories with multiple power supply domains, those domains may require specific power sequencing. If the behavior of a reusable, legacy power supply block is not entirely known, forbidden operation modes may appear, thus compromising memory operation and reliability.

BRIEF DESCRIPTION OF THE DRAWINGS

Embodiments of the present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

To address and/or avoid various problems that may arise when legacy power supply circuits are reused in the design of new flash memories, the inventors hereof have developed diagnostic circuitry in the form of slew rate detector(s). These slew rate detector(s) may be configured to identify power supply slew rates during ramp up for a range of slopes. In some embodiments, power supply slew rate detector(s) may be read in a digital fashion, allowing the slew rate information to be read and/or addressed using digital circuitry.

Figure 1:
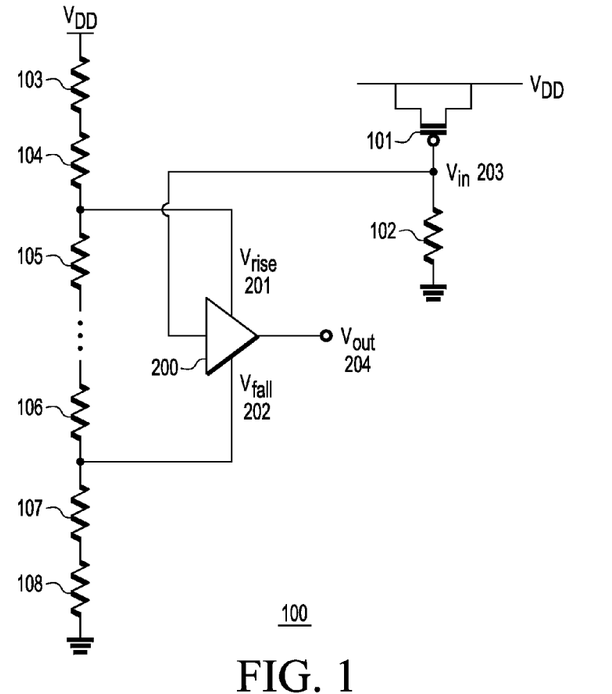
FIG. 1 is a diagram of an example of a power supply slew rate detector according to some embodiments.

FIG. 1 is a diagram of an example of power supply slew rate detector 100 according to some embodiments. Particularly, power supply slew rate detector 100 is configured to identify the slew rate of power supply voltage $V_{dd}$, for instance, during a ramp up or start up process. To that end, power supply slew rate detector 100 includes RC filter 101-102, Schmitt trigger 200, and a number of voltage divider elements (e.g., resistors) 103-108.

As illustrated, transistor 101 (here a PMOS transistor) serves as a capacitor and has its gate terminal coupled to resistor 102, which in turn is coupled to a ground or reference terminal. The node between transistor 101 and resistor 102 serves as input voltage $V_{in}$ 203 to Schmitt trigger 200. Also, $V_{dd}$ is applied to voltage divider elements 103-108, which in this case include a plurality of resistors coupled in series. A first selected node of voltage divider elements 103-108 provides first threshold value $V_{rise}$ 201, and a second selected node of voltage divider elements 103-108 provides second threshold value $V_{fall}$ 202 to Schmitt trigger 200. The output of Schmitt trigger 200 is given at $V_{out}$ 204. Although resistive voltage divider elements 103-108 are used in this example, it should be noted that in other embodiments threshold values $V_{rise}$ 201 and $V_{fall}$ 202 may be obtained in other suitable ways.

In operation, RC filter 101-102 is configured to capture variations in $V_{dd}$ over time, and to provide those values to Schmitt trigger 200 in the form $V_{in}$ 203. High threshold value $V_{rise}$ 201 may be selected (e.g., 50%, 80%, 90%, etc.) to identify a corresponding slope or slew rate of $V_{dd}$, whereas low threshold value $V_{fall}$ 202 may be selected to allow a sufficient time for $V_{out}$ 204 to be read and then reset to its original value (e.g., 0 V). In a non-inverting configuration, when $V_{out}$ 204 assumes a high logic value (i.e., 1), it indicates that $V_{dd}$ has achieved the slope or slew rate selected via $V_{rise}$ 201.

In some cases, Schmitt trigger 200 may have high and/or low thresholds values $V_{rise}$ 201 and/or $V_{fall}$ 202 near the supply rails (e.g., $V_{dd}$ and ground) while being less PVT sensitive than traditional Schmitt triggers. As described in more detail below, Schmitt trigger 200 may employ devices of the same doping type when comparing a threshold voltage $V_{rise}$ 201 and $V_{fall}$ 202 to input voltage $V_{in}$ 203. As $V_{in}$ 203 rises ("rising trip"), Schmitt trigger 200 receives a high threshold voltage at an NMOS device and $V_{in}$ 203 is applied to another NMOS device. These NMOS devices are coupled to each other through a PMOS-based current mirror. Conversely, as $V_{in}$ 203 falls ("falling trip"), a low threshold voltage is applied to a PMOS device and the input voltage is applied to another PMOS device. These PMOS devices are coupled to each other through an NMOS-based current mirror.

Figure 2:
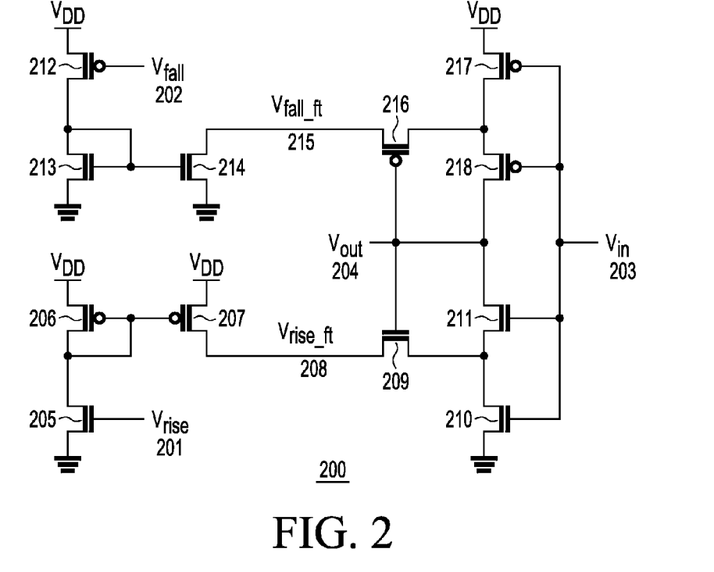
FIG. 2 is a circuit diagram of an example of a Schmitt trigger circuit according to some embodiments.

To further illustrate the foregoing, FIG. 2 is a circuit diagram of an example of Schmitt trigger 200. In some embodiments, Schmitt trigger 200 may be implemented within power supply slew rate detector 100 of FIG. 1. As illustrated, $V_{rise}$ 201 is a high threshold voltage value, $V_{fall}$ 202 is a low threshold voltage value, $V_{in}$ 203 is a time-varying input signal, and $V_{out}$ 204 is the output of circuit 200. In this example, the bottom half of circuit 200 (i.e., below $V_{out}$ 204) is referred to as "rising trip" portion of circuit 200, whereas the top half of circuit 200 (i.e., above $V_{out}$ 204) is referred to as "falling trip" portion of circuit 200.

In the rising trip portion, NMOS transistor 205 is configured to receive $V_{rise}$ 201, a high threshold voltage value, at its gate. The source of NMOS transistor 205 is operably coupled to ground, and the drain of NMOS transistor 205 is operably coupled to the drain of PMOS transistor 206. The source of PMOS transistor 206 is operably coupled to supply voltage $V_{dd}$. The drain of PMOS transistor 206 is also operably coupled to the gates of PMOS transistor 206 and of PMOS transistor 207. The source of PMOS transistor 207 is operably coupled to supply voltage $V_{dd}$, and the drain of PMOS transistor 207 is operably coupled to the drain of NMOS transistor 209. The gate of NMOS transistor 209 is operably coupled to $V_{out}$ 204, and the source of NMOS transistor 209 is operably coupled to the drain of NMOS transistor 210. The gate of NMOS transistor 210 is operably coupled to $V_{in}$ 203, and the source of NMOS transistor 210 is operably coupled to ground. NMOS transistor 211 has its gate operably coupled to $V_{in}$ 203, its drain operably coupled to $V_{out}$ 204, and its source operably coupled to the drain of NMOS transistor 210.

In the falling trip portion, PMOS transistor 212 is configured to receive $V_{fall}$ 202, a low threshold voltage value, at its gate. The source of PMOS transistor 212 is operably coupled to supply voltage $V_{dd}$, and the drain of PMOS transistor 212 is operably coupled to the drain of NMOS transistor 213. The source of NMOS transistor 213 is operably coupled to ground. The drain of NMOS transistor 213 is also operably coupled to the gates of NMOS transistor 213 and of NMOS transistor 214. The source of NMOS transistor 214 is operably coupled to ground, and the drain of NMOS transistor 214 is operably coupled to the drain of PMOS transistor 216. The gate of PMOS transistor 216 is operably coupled to $V_{out}$ 204, and the source of PMOS transistor 216 is operably coupled to the drain of PMOS transistor 217. The gate of PMOS transistor 217 is operably coupled to $V_{in}$ 203, and the source of PMOS transistor 210 is operably coupled to $V_{dd}$. PMOS transistor 218 has its gate operably coupled to $V_{in}$ 203, its drain operably coupled to $V_{out}$ 204, and its source operably coupled to the drain of PMOS transistor 217.

With respect to the rising trip portion of circuitry 200, it should be noted that a comparison is made between $V_{rise}$ 201 and $V_{in}$ 203 by NMOS transistors 205 and 210. PMOS transistors 206 and 207 operate as a 1:1 current mirror ("PMOS-based current mirror"), and NMOS transistor 209 operates as a switch that activates or deactivates the rising trip portion. Conversely, in the falling trip portion of circuitry 200, a comparison is made between $V_{fall}$ 202 and $V_{in}$ 203 by PMOS transistors 212 and 217. NMOS transistors 213 and 214 operate as a 1:1 current mirror ("NMOS-based current mirror"), and PMOS transistor 216 operates as a switch that activates or deactivates the falling trip portion.

In some implementations, $V_{rise}$ 201 and $V_{fall}$ 202 may each have an absolute value within approximately 10% (or less) of the supply rail; thus providing rail-to-rail or near rail-to-rail hysteresis. For example, $V_{dd}$ may be equal to 3.0 V, $V_{rise}$ 201 may be equal to 2.8, and $V_{fall}$ 202 may be equal to 0.2 V. It should be noted, however, that the exact values used for these signals may vary depending upon the particular application, design, technology, or implementation.

Operation of Schmitt trigger 200 may be conveniently explained by examining the rising and falling trip circuitry separately. Particularly, operation of the rising trip circuitry is explained as follows. In its initial condition, $V_{out}$ 204 is at a first logical state, for instance, with a voltage level equal to $V_{dd}$. As previously noted, $V_{out}$ 204 remains at this first logical state until $V_{in}$ 203 becomes greater than a high threshold value (e.g., $V_{rise}$ 201). In this initial state, PMOS transistor 216 is turned off and falling trip circuitry is essentially decoupled from the rest of circuit 200 for purposes of this analysis. Moreover, when $V_{in}$ 203 is close to $V_{dd}$ (i.e., close to the supply rail), PMOS devices 217 and 218 are operating in weak-inversion mode, so in a first order analysis threshold disturbances may be left aside.

NMOS transistor 205 receives $V_{rise}$ 201 and NMOS transistor 210 receives $V_{in}$ 203. The current through NMOS transistor 205 is mirrored by the PMOS-based current mirror including PMOS transistors 206 and 207. The gate of NMOS transistor 209 also receives $V_{out}$ 204=$V_{dd}$, and thus it is closed (i.e., forming a short circuit). As such, transitions are made by current comparison.

Specifically, $V_{rise\_ft}$ 208 is applied to the drain of NMOS transistor 210. When $V_{in}$ 203 is smaller than $V_{rise}$ 201, $V_{rise\_ft}$ 208 is at $V_{dd}$. Also, when $V_{in}$ 203 is equal to $V_{rise}$ 201, $V_{rise\_ft}$ 208 is equal to $V_{dd}/2$. Also, both current sources generated from NMOS transistor 205 and 210 have the same gate-to-source voltage ($V_{gs}$). Then, when $V_{in}$ 203 is greater than $V_{rise}$ 201, $V_{rise\_ft}$ 208 goes to ground (e.g., 0 V). In other words, when $V_{in}$ 203 is greater than $V_{rise}$ 201, both NMOS transistors 210 and 211 are closed, therefore causing $V_{out}$ 204 to also go to ground (e.g., 0 V). Here it should be noted that NMOS transistor 211 turns on quickly due to its increasing gate-to-source voltage (211's $V_{gs}=V_{in}$ 201$-V_{rise\_ft}$ 208).

Figure 3:
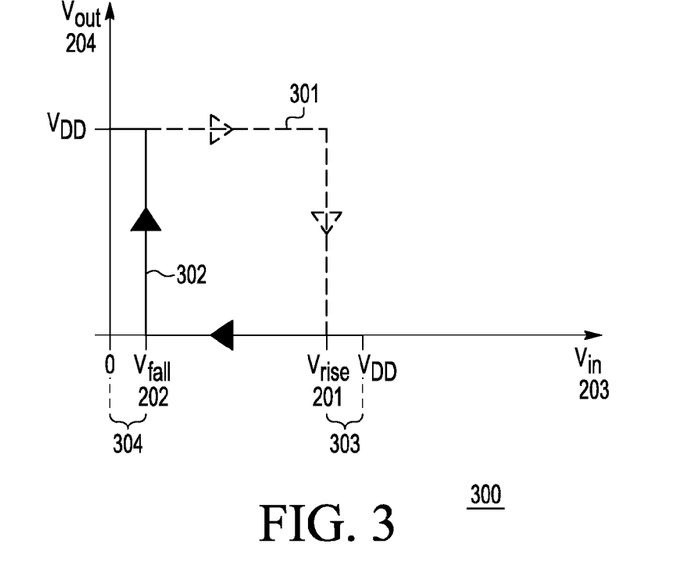
FIG. 3 is a graph illustrating a hysteresis loop of a Schmitt trigger circuit with quasi rail-to-rail hysteresis according to some embodiments.
Figure 4:
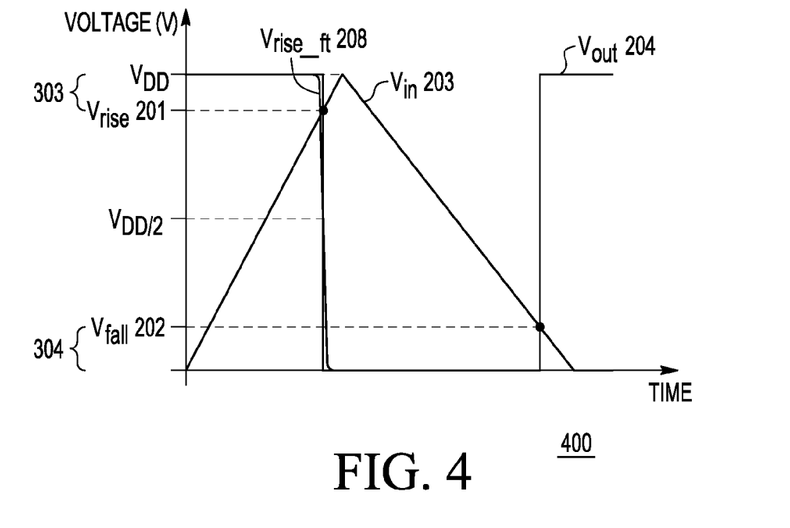
FIG. 4 is a graph illustrating operation of a Schmitt trigger circuit with quasi rail-to-rail hysteresis over time according to some embodiments.

To facilitate explanation, FIG. 3 shows graph 300 of a hysteresis loop of Schmitt trigger circuitry 200 according to some embodiments. In graph 300, curve 301 shows the behavior of $V_{out}$ 204 as $V_{in}$ 203 increases in value. That is, $V_{out}$ 204 stays at $V_{dd}$ until $V_{in}$ 203 rises up to $V_{rise}$ 201, after which $V_{out}$ 204 goes to 0 V. Meanwhile, FIG. 4 shows a graph of the output voltage in comparison with the input voltage (hysteresis loop) of Schmitt trigger circuitry 200, according to some embodiments. With respect to graph 400, it may be noted that, as $V_{in}$ 203 increases from 0 V, $V_{out}$ 204 remains at $V_{dd}$ until $V_{in}$ 203 overcomes $V_{rise}$ 201, after which $V_{out}$ 204 drops to 0 V despite $V_{in}$ 203 continuing to increase between $V_{rise}$ 201 and $V_{dd}$. In some embodiments, the difference $\Delta V$ 303 between $V_{dd}$ and $V_{rise}$ 201 may be within 10% of the value of $V_{dd}$.

Referring back to FIG. 2, once $V_{out}$ 204 assumes the second logical state (e.g., $V_{out}$ 204 equals ground or 0 V), $V_{out}$ 204 may remain in that condition until $V_{in}$ 203 drops below a low threshold value (e.g., $V_{fall}$ 202). In this situation, NMOS transistor 209 is turned off and the rising trip circuitry is essentially decoupled from the rest of circuit 200 for purposes of this analysis. Moreover, when $V_{in}$ 203 is close to 0 V (i.e., close to the ground rail), NMOS devices 210 and 211 are operating in weak-inversion mode, so in a first order analysis, threshold disturbances are not substantial.

PMOS transistor 212 receives $V_{fall}$ 202 and PMOS transistor 217 receives $V_{in}$ 203. The current through PMOS transistor 212 is mirrored by the NMOS-based current mirror including NMOS transistors 213 and 214. The gate of PMOS transistor 216 also receives $V_{out}$ 204=0 V, and thus it is closed (i.e., forming a short circuit). Similarly as above, here the transitions are also made by current comparison. As such, $V_{fall\_ft}$ 215 is applied to the drain of PMOS transistor 217. Also, when $V_{in}$ 203 is greater than $V_{fall}$ 202, $V_{fall\_ft}$ 215 is at 0 V. When $V_{in}$ 203 is equal to $V_{rise}$ 201, $V_{fall\_ft}$ 215 is ideally equal to $V_{dd}/2$. Then, when $V_{in}$ 203 is smaller than $V_{fall}$ 202, $V_{fall\_ft}$ 215 goes to $V_{dd}$. In other words, when $V_{in}$ 203 is smaller than $V_{fall}$ 202, both PMOS transistors 217 and 218 are closed, therefore causing $V_{out}$ 204 to reach the supply rail. Here it should be noted that PMOS transistor 218 turns on quickly due to an increasing gate-to-source voltage (218's $V_{gs}=V_{fall}$ 202$-(V_{dd}/2) \cong V_{dd}/2$).

Referring back to FIG. 3, graph 300, curve 302 shows the behavior of $V_{out}$ 204 as $V_{in}$ 203 decreases in value. That is, $V_{out}$ 204 stays at 0 V until $V_{in}$ 203 becomes smaller than $V_{fall}$ 202, after which $V_{out}$ 204 goes to $V_{dd}$. In FIG. 4 it may be noted that, as $V_{in}$ 203 decreases from $V_{dd}$, $V_{out}$ 204 remains at 0 V until $V_{in}$ 203 reaches $V_{fall}$ 202, after which $V_{out}$ 204 rises to $V_{dd}$ despite $V_{in}$ 203 continuing to decrease between $V_{fall}$ 202 and 0 V. In some embodiments, the difference $\Delta V$ 304 between $V_{fall}$ 202 and 0 V may be within 10% of the value of $V_{dd}$, thus providing hysteresis characteristics that are the difference between $V_{rise}$ 201 and $V_{fall}$ 202.

Although in the example described above the first and second logical states are shown as $V_{dd}$ and 0 V (or ground), respectively, it should be noted that other configurations are possible. For example, in a non-inverting configuration, when $V_{in}$ 203 is higher than the $V_{rise}$ 201, $V_{out}$ 204 is at a logic high (e.g., "$V_{dd}$"), and, when $V_{in}$ 203 is lower that $V_{fall}$ 202, $V_{out}$ 204 is at a logic low (e.g., "0" or ground). In an inverting configuration, when $V_{in}$ 203 is higher than $V_{rise}$ 201, $V_{out}$ 204 is at a logic low, and, when $V_{in}$ 203 is below $V_{fall}$ 202, $V_{out}$ 204 is at a logic high.

It should be noted that Schmitt trigger circuitry 200 is shown by way of illustration, and that certain variations are contemplated. For example, in some embodiments, an additional NMOS switch (not shown) may be operably coupled between MOS transistor 205 and PMOS transistor 206 to shut off the electric current flowing through NMOS transistor 205 upon $V_{out}$ 204's transition, for example, using an enabling signal. Additionally or alternatively, an additional PMOS switch (not shown) may be operably coupled between PMOS transistor 212 and NMOS transistor 213 to shut off the electric current flowing through PMOS transistor 212 upon $V_{out}$ 204's transition, for example, using the inverse or complement of the same enabling signal. As such, current mirrors 206-207 and 213-214 are disabled when not in use, thus resulting in additional power savings.

Returning to FIG. 1, RC filter circuit 101-102 may be designed to capture different ranges of slew rates of power supply voltage $V_{dd}$. Particularly, assuming that $V_{in}(t)=\alpha \cdot t$, where a is the ramp slope of $V_{dd}$, the transient response of RC filter circuit 101-102 is given by:

$$V_{in}(t) = \alpha \cdot R \cdot C\left(1 - e^{-\frac{t}{R \cdot C}}\right) \quad \text{Eq. 1}$$

Where C is the capacitance presented by transistor 101 and R is the resistance of resistive element 102. Moreover, $V_{in}$ 203 may be calculated at the moment where $V_{in}(t)$ reaches steady state, that is, after a $\Delta t$ moment, as a function of $\alpha$, in order to be correlated with with Schmitt trigger threshold values via Eq. 2 below:

$$V_{in}(t) = \alpha \cdot R \cdot C\left(1 - e^{-\frac{V_{in}}{\alpha \cdot R \cdot C}}\right) \quad \text{Eq. 2}$$

Figure 5:
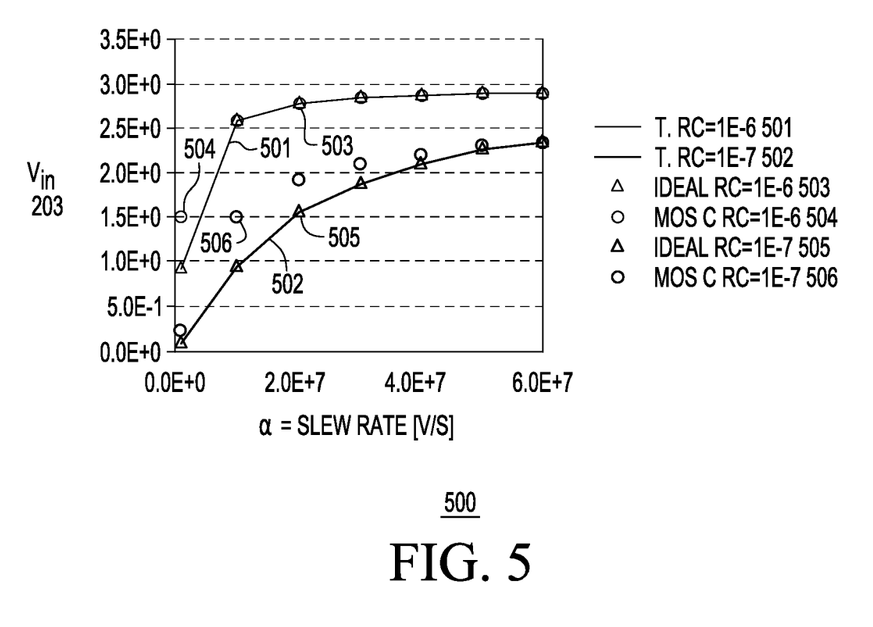
FIG. 5 is a graph illustrating $V_{in}$ as a function of slew rate slope values for different filter circuits according to some embodiments.

Referring now to FIG. 5, a graph illustrating $V_{in}$ 203 (vertical axis) as a function of slew rate slope values $\alpha$ (horizontal axis) according to Eq. 2 for different filter circuits is depicted. As shown, for a given RC, $V_{in}$ 203 presents a different variation ratio that can be leveraged to design trigger points of Schmitt trigger 200.

Particularly, different RC time constants (T.RC=1E-6 and T.RC=1E-7) were used to implement filter circuit 101-102. Two different ideal theoretical curves (with ideal R and C components) for different time constants are compared to one another as represented by curves 503 and 505. In addition, corresponding curves for the same time constants implemented with a PMOS transistor (working as a capacitor) together with available resistors are shown by curves 504 and 506.

Accordingly, FIG. 5 shows that theoretical curves 503 and 505 and practical curves 504 and 506 are only slightly different from each other, mostly due to second order effects and/or due to the use of real components such as PMOS transistor(s) and/or resistor(s). FIG. 5 also shows that, depending on the time constant value, which is correlated to silicon area, the first time constant (T.RC=1E-6) is more sensitive for smaller slew rates, as shown by curve 501, while the second time constant (T.RC=1E-7) is better fitted for higher time constant, as shown by curve 502.

Figure 6:
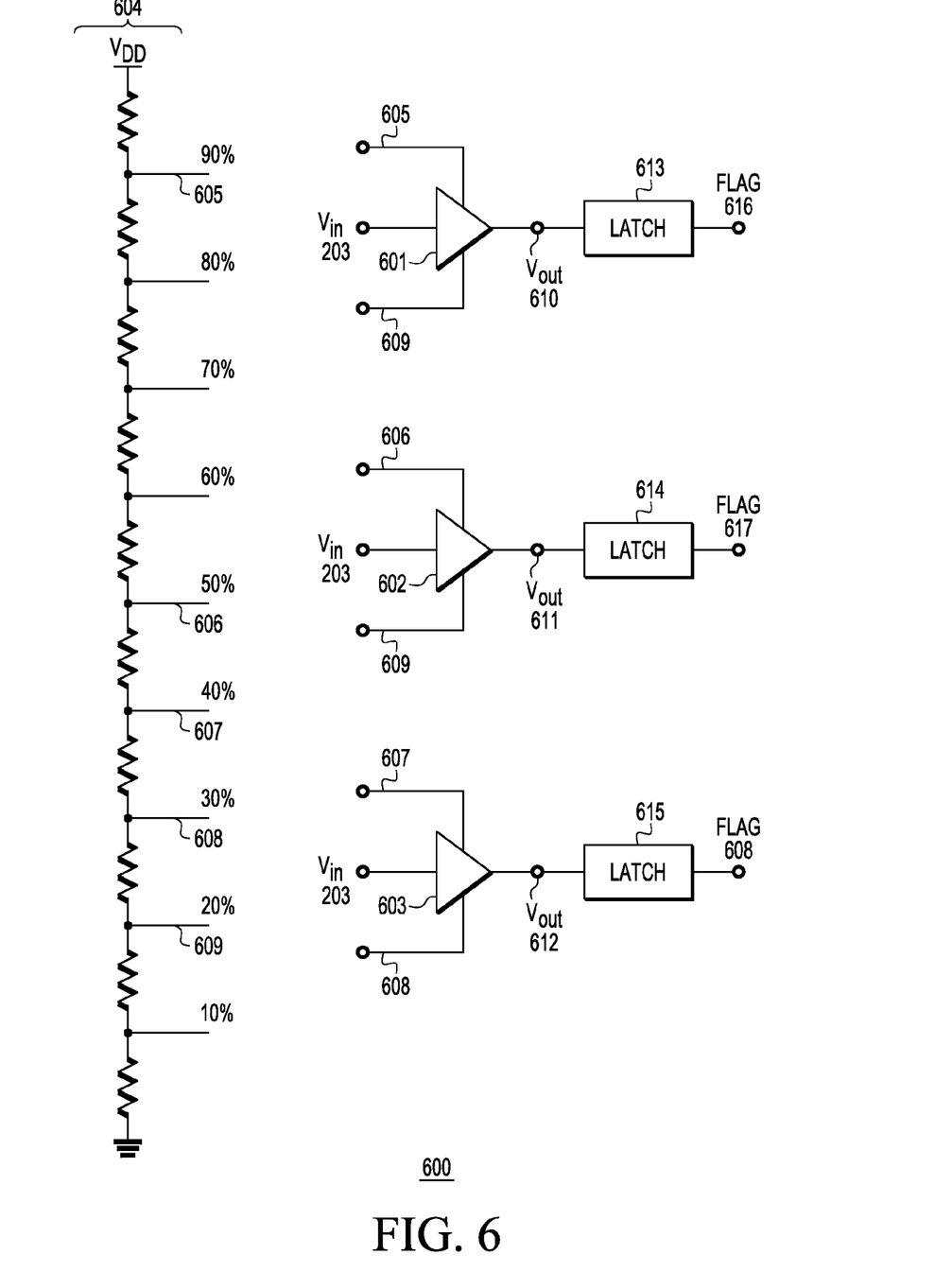
FIG. 6 is a diagram of an example of an implementation of a power supply slew rate detector using multiple Schmitt triggers according to some embodiments.

FIG. 6 is a diagram of an example of an implementation 600 of a power supply slew rate detector using multiple Schmitt triggers. In this embodiment, voltage divider 604 includes ten resistors and corresponding nodes configured to provide voltage threshold values equal to 90% through 10% of $V_{dd}$. First Schmitt trigger 601 has its high threshold terminal $V_{rise}$ coupled to node 605 (90% of $V_{dd}$) and its low threshold terminal $V_{fall}$ coupled to node 609 (20% of $V_{dd}$). Second Schmitt trigger 602 has its high threshold terminal $V_{rise}$ coupled to node 606 (50% of $V_{dd}$) and its low threshold terminal $V_{fall}$ also coupled to node 609 (20% of $V_{dd}$). Third Schmitt trigger 603 has its high threshold terminal $V_{rise}$ coupled to node 607 (40% of $V_{dd}$) and its low threshold terminal $V_{fall}$ coupled to node 608 (30% of $V_{dd}$). It should be noted that, for sake of this example, the values of nodes 605-609 have been arbitrarily selected.

First output $V_{out}$ 610 of first Schmitt trigger 601 is coupled to first latch 613, which is configured to provide first flag 616. Second output $V_{out}$ 611 of second Schmitt trigger 602 is coupled to second latch 614, which is configured to provide second flag 617. Third output $V_{out}$ 612 of third Schmitt trigger 603 is coupled to third latch 615, which is configured to provide third flag 618.

In operation, when the slew rate of $V_{dd}$ reaches the high threshold terminal $V_{rise}$ of third Schmitt trigger 603, third latch 615 changes the value of third flag 618 (e.g., from 0 to 1), thus indicating a slope a between 0 and 40% of $V_{dd}$. When the slew rate reaches the high threshold terminal $V_{rise}$ of second Schmitt trigger 602, second latch 615 changes the value of second flag 617, thus indicating a slope a between 40% and 50% of $V_{dd}$. Finally, when the high threshold terminal $V_{rise}$ of first Schmitt trigger 601 reaches the high threshold terminal $V_{rise}$ of first Schmitt trigger 601, first latch 613 changes the value of first flag 616, thus indicating a slope a between 50% and 90% of $V_{dd}$.

Depending upon which of flags 616-618 have been set (e.g., from a low logic level to a logic high level), it is then possible to determine the slew rate of power supply output $V_{dd}$. For example, if all flags 616-618 are set, this indicates that the slew rate of $V_{dd}$ has a slope between 90% and 100% of its nominal value. If second and third flags 617 and 618 are set but first flag 616 is not, then this indicates that the slew rate of $V_{dd}$ has a slope between 50% and 80% of its nominal value. Finally, if only third flag 618 is set, then the slew rate of $V_{dd}$ has a slope of less than 40% of its nominal value.

In some embodiments, the power supply slew rate detector(s) described herein may be used without the need for reference circuits, such current and/or bandgap reference circuits, in a flash memory circuit. Moreover, flag(s) may be generated to indicate the slope of power supply circuits in multiple power domains.

In many implementations, the systems and methods disclosed herein may be incorporated into a wide range of electronic devices including, for example, computer systems or Information Technology (IT) products such as servers, desktops, laptops, memories, switches, routers, etc.; telecommunications hardware; consumer devices or appliances such as mobile phones, tablets, television sets, cameras, sound systems, etc.; scientific instrumentation; industrial robotics; medical or laboratory electronics such as imaging, diagnostic, or therapeutic equipment, etc.; transportation vehicles such as automobiles, buses, trucks, trains, watercraft, aircraft, etc.; military equipment, etc. More generally, these systems and methods may be incorporated into any device or system having one or more electronic parts or components.

Figure 7:
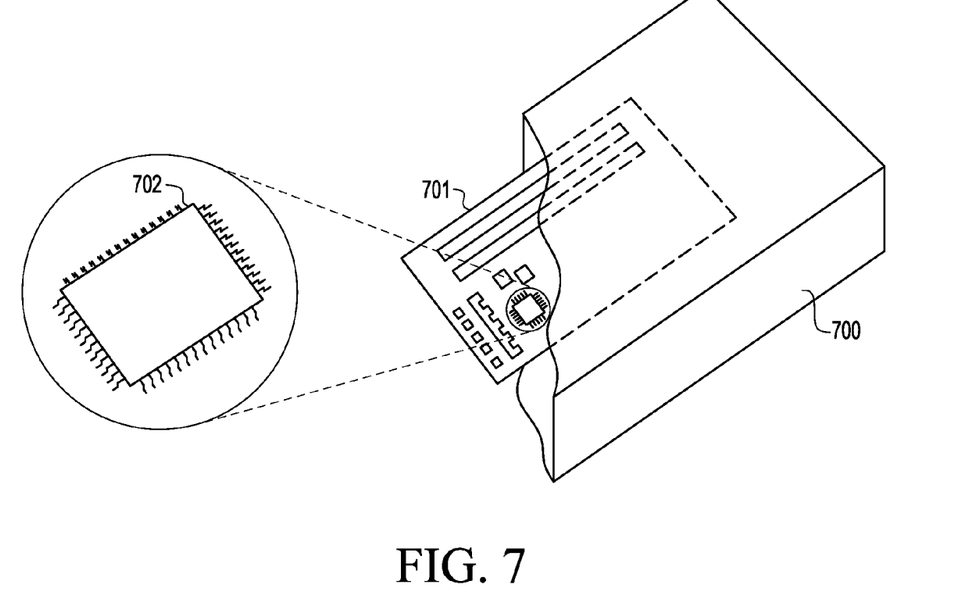
FIG. 7 is a diagram of an example of an electronic system comprising one or more integrated circuits according to some embodiments.

Turning to FIG. 7, a block diagram of electronic system 700 is depicted. In some embodiments, electronic system 700 may be included in any of the aforementioned electronic devices, or any other electronic device. As illustrated, electronic system 700 includes one or more Printed Circuit Boards (PCBs) 701, and at least one of PCBs 701 includes one or more microelectronic device packages(s) 702. In some implementations, device package(s) 702 may include one or more power supply slew rate detector circuits as discussed above.

Examples of device package(s) 702 may include, for instance, a System-On-Chip (SoC), an Application Specific Integrated Circuit (ASIC), a Digital Signal Processor (DSP), a Field-Programmable Gate Array (FPGA), a processor, a microprocessor, a controller, a microcontroller (MCU), a Graphics Processing Unit (GPU), or the like. Additionally or alternatively, device package(s) 502 may include a memory circuit or device such as, for example, a Random Access Memory (RAM), a Static RAM (SRAM), a Magnetoresistive RAM (MRAM), a Nonvolatile RAM (NVRAM, such as "FLASH" memory, etc.), and/or a Dynamic RAM (DRAM) such as Synchronous DRAM (SDRAM), a Double Data Rate RAM, an Erasable Programmable ROM (EPROM), an Electrically Erasable Programmable ROM (EEPROM), etc. Additionally or alternatively, device package(s) 702 may include one or more mixed-signal or analog circuits, such as, for example, Analog-to-Digital Converter (ADCs), Digital-to-Analog Converter (DACs), Phased Locked Loop (PLLs), oscillators, filters, amplifiers, etc. Additionally or alternatively, device package(s) 702 may include one or more Micro-ElectroMechanical Systems (MEMS), Nano-ElectroMechanical Systems (NEMS), or the like.

Generally speaking, device package(s) 702 may be configured to be mounted onto PCB 701 using any suitable packaging technology such as, for example, Ball Grid Array (BGA) packaging or the like. In some applications, PCB 701 may be mechanically mounted within or fastened onto electronic device 700. It should be noted that, in certain implementations, PCB 701 may take a variety of forms and/or may include a plurality of other elements or components in addition to device package(s) 702. It should also be noted that, in some embodiments, PCB 701 may not be used and/or device package(s) 702 may assume any other suitable form(s).

In an illustrative, non-limiting embodiment, a power supply slew rate detector may include a filter circuit having a capacitive element operably coupled to a power supply output provided to a flash memory circuit and a resistive element operably coupled to the capacitive element and to ground, and a Schmitt trigger having an input operably coupled to a node between the capacitive element and the resistive element, the Schmitt trigger further having an output configured to indicate a slew rate of the power supply output.

For example, the capacitive element may include a Metal-Oxide-Semiconductor (MOS) transistor. The output may be configured to identify a selected range of slew rate values. Additionally or alternatively, the output may be configured to indicate the slew rate based upon a comparison between a voltage at the node and a selected threshold voltage. Also, the threshold voltage may be selected via a voltage divider as a percentage of the power supply output.

In some cases, the Schmitt trigger may include rising trip circuitry configured to switch an output node from a first logic state to a second logic state in response to an input voltage being greater than a high threshold voltage, the rising trip circuitry including a first NMOS transistor configured to receive the high threshold voltage and a second NMOS transistor configured to receive the input voltage, the first NMOS transistor operably coupled to the second NMOS transistor through a PMOS current mirror.

The Schmitt trigger may also include falling trip circuitry operably coupled to the rising trip circuitry and configured to switch the output node from the second logic state to a first logic state in response to the input voltage being smaller than a low threshold voltage, the falling trip circuitry including a first PMOS transistor configured to receive the low threshold voltage and a second PMOS transistor configured to receive the input voltage, the first PMOS transistor operably coupled to the second PMOS transistor through an NMOS current mirror.

The PMOS current mirror may be a 1:1 current mirror having two or more PMOS transistors. A gate of the first NMOS transistor may be configured to receive the high threshold voltage, and a drain of the first NMOS transistor may be operably coupled to the PMOS current mirror. An output of the PMOS current mirror may be operably coupled to a drain of the second NMOS transistor through a first switch, a gate of the first switch may be operably coupled to the output node, and a gate of the second NMOS transistor may be configured to receive the input voltage.

The first switch may be another NMOS transistor having its gate operably coupled to the output node. A third NMOS transistor may have a drain operably coupled to the output node, its source operably coupled to the drain of the second NMOS transistor, and its gate operably coupled to the input voltage. The NMOS current mirror may be a 1:1 current mirror having two or more NMOS transistors. A gate of the first PMOS transistor may be configured to receive the low threshold voltage, and a source of the first PMOS transistor may be operably coupled to the NMOS current mirror.

An output of the NMOS current mirror may be operably coupled to a source of the second PMOS transistor through a second switch, a gate of the second switch may be operably coupled to the output node, and a gate of the second PMOS transistor may be configured to receive the input voltage. The second switch may be another PMOS transistor having its gate operably coupled to the output node. A third PMOS transistor may have a source operably coupled to the output node, its drain operably coupled to the source of the second PMOS transistor, and its gate operably coupled to the input voltage.

In another illustrative, non-limiting embodiment, a method may include monitoring an input voltage at a node within an RC filter operably coupled to a power supply output provided to a flash memory circuit, and switching an output node of a Schmitt trigger from a first logic state to a second logic state in response to the input voltage meeting a threshold voltage, where the second logic state indicates that a slew rate of the power supply output is within a selected range of values, where the threshold voltage is applied to a first transistor of a first doping type and the input voltage is applied to a second transistor of the first doping type, the first and second transistors operably coupled to each other through a current mirror of a second doping type. The method may further include selecting the threshold voltage via a voltage divider as a percentage of the power supply output.

In yet another illustrative, non-limiting embodiment, an electronic circuit may include a power supply circuit configured to provide power to at least one of a plurality of power domains within a flash memory circuit, and a power supply slew rate detector circuit operably coupled to the power supply circuit, the power supply slew rate detector circuit including a filter circuit having a capacitive element operably coupled to a power supply output and a resistive element operably coupled to the capacitive element and to ground, the power supply slew rate detector circuit further including a first Schmitt trigger having an input operably coupled to a node between the capacitive element and the resistive element and an output configured to indicate a first range slew rate values of the power supply output. The power supply slew rate detector circuit may further include a second Schmitt trigger having an input operably coupled to the node between the capacitive element and the resistive element and an output configured to indicate a second range slew rate values of the power supply output.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A power supply slew rate detector, comprising:
   a filter circuit including a capacitive element operably coupled to a power supply output provided to a flash memory circuit, and a resistive element operably coupled to the capacitive element and to ground; and
   a Schmitt trigger comprising an input operably coupled to a node between the capacitive element and the resistive element, the Schmitt trigger further comprising an output configured to indicate a slew rate of the power supply output, the Schmitt trigger further comprising:
      rising trip circuitry configured to switch an output node from a first logic state to a second logic state in response to an input voltage being greater than a high threshold voltage, the rising trip circuitry including a first NMOS transistor configured to receive the high threshold voltage and a second NMOS transistor configured to receive the input voltage, the first NMOS transistor operably coupled to the second NMOS transistor through a PMOS current mirror; and
      falling trip circuitry operably coupled to the rising trip circuitry and configured to switch the output node from the second logic state to a first logic state in response to the input voltage being smaller than a low threshold voltage, the falling trip circuitry including a first PMOS transistor configured to receive the low threshold voltage and a second PMOS transistor configured to receive the input voltage, the first PMOS transistor operably coupled to the second PMOS transistor through an NMOS current mirror.

2. The power supply slew rate detector of claim 1, wherein the capacitive element includes a Metal-Oxide-Semiconductor (MOS) transistor.

3. The power supply slew rate detector of claim 1, wherein the output is configured to identify a selected range of slew rate values.

4. The power supply slew rate detector of claim 1, wherein the output is configured to indicate the slew rate based upon a comparison between a voltage at the node and a selected threshold voltage.

5. The power supply slew rate detector of claim 4, wherein the threshold voltage is selected via a voltage divider as a percentage of the power supply output.

6. The power supply slew rate detector of claim 1, wherein the PMOS current mirror is a 1:1 current mirror having two or more PMOS transistors.

7. The power supply slew rate detector of claim 1, wherein a gate of the first NMOS transistor is configured to receive the high threshold voltage, and wherein a drain of the first NMOS transistor is operably coupled to the PMOS current mirror.

8. The power supply slew rate detector of claim 1, wherein an output of the PMOS current mirror is operably coupled to a drain of the second NMOS transistor through a first switch, wherein a gate of the first switch is operably coupled to the output node, and wherein a gate of the second NMOS transistor is configured to receive the input voltage.

9. The power supply slew rate detector of claim 8, wherein the first switch is another NMOS transistor having its gate operably coupled to the output node.

10. The power supply slew rate detector of claim 8, further comprising a third NMOS transistor having a drain operably coupled to the output node, its source operably coupled to the drain of the second NMOS transistor, and its gate operably coupled to the input voltage.

11. The power supply slew rate detector of claim 8, wherein the NMOS current mirror is a 1:1 current mirror having two or more NMOS transistors.

12. The power supply slew rate detector of claim 1, wherein a gate of the first PMOS transistor is configured to receive the low threshold voltage, and wherein a source of the first PMOS transistor is operably coupled to the NMOS current mirror.

13. The power supply slew rate detector of claim 12, wherein an output of the NMOS current mirror is operably coupled to a source of the second PMOS transistor through a second switch, wherein a gate of the second switch is operably coupled to the output node, and wherein a gate of the second PMOS transistor is configured to receive the input voltage.

14. The power supply slew rate detector of claim 13, wherein the second switch is another PMOS transistor having its gate operably coupled to the output node.

15. The power supply slew rate detector of claim 14, further comprising a third PMOS transistor having a source operably coupled to the output node, its drain operably coupled to the source of the second PMOS transistor, and its gate operably coupled to the input voltage.

16. A method, comprising:
monitoring an input voltage at a node within an RC filter operably coupled to a power supply output provided to a flash memory circuit; and
switching an output node of a Schmitt trigger from a first logic state to a second logic state in response to the input voltage meeting a threshold voltage, wherein the second logic state indicates that a slew rate of the power supply output is within a selected range of values, wherein the threshold voltage is applied to a first transistor of a first doping type and the input voltage is applied to a second transistor of the first doping type, the first and second transistors operably coupled to each other through a current mirror of a second doping type.

17. The method of claim 16, further comprising selecting the threshold voltage via a voltage divider as a percentage of the power supply output.

18. An electronic circuit, comprising:
a power supply circuit configured to provide power to at least one of a plurality of power domains within a flash memory circuit; and
a power supply slew rate detector circuit operably coupled to the power supply circuit, the power supply slew rate detector circuit including a filter circuit having a capacitive element operably coupled to a power supply output and a resistive element operably coupled to the capacitive element and to ground, the power supply slew rate detector circuit further including a first Schmitt trigger having an input operably coupled to a node between the capacitive element and the resistive element and an output configured to indicate a first range slew rate values of the power supply output, the power supply slew rate detector circuit further including a second Schmitt trigger having an input operably coupled to the node between the capacitive element and the resistive element and an output configured to indicate a second range slew rate values of the power supply output.

* * * * *